US009148973B2

(12) United States Patent
Liang et al.

(10) Patent No.: US 9,148,973 B2
(45) Date of Patent: Sep. 29, 2015

(54) ELECTRONIC DEVICE WITH POWER SUPPLY CONTROL MODULE

(71) Applicant: ShenZhen Goldsun Network Intelligence Technology Co., Ltd., Shenzhen (CN)

(72) Inventors: Wei-Kuang Liang, New Taipei (TW); Hsien-Pin Tsou, New Taipei (TW); Chuan-Xiang Wang, Shenzhen (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 195 days.

(21) Appl. No.: 13/931,537

(22) Filed: Jun. 28, 2013

(65) Prior Publication Data

US 2014/0140013 A1    May 22, 2014

(30) Foreign Application Priority Data

Nov. 19, 2012    (CN) .......................... 2012 1 0467392

(51) Int. Cl.
H05K 7/00       (2006.01)
H05K 7/06       (2006.01)
G06F 1/16       (2006.01)
G06F 1/18       (2006.01)

(52) U.S. Cl.
CPC ............... *H05K 7/06* (2013.01); *G06F 1/1613* (2013.01); *G06F 1/1635* (2013.01); *G06F 1/1656* (2013.01); *G06F 1/1658* (2013.01); *G06F 1/188* (2013.01)

(58) Field of Classification Search
CPC ... G06F 1/1613; G06F 1/1635; G06F 1/1656; G06F 1/1658; G06F 1/188; H05K 7/06

USPC .................................................. 361/809, 810
See application file for complete search history.

(56) References Cited

U.S. PATENT DOCUMENTS

| 5,762,512 | A  | * | 6/1998 | Trant et al. ..................... 439/347 |
| 5,766,026 | A  | * | 6/1998 | Cooper et al. ............... 439/76.1 |
| 5,790,040 | A  | * | 8/1998 | Kreier et al. ............... 340/693.1 |
| 6,051,334 | A  | * | 4/2000 | Tsurumaru et al. ............. 429/97 |
| 6,094,357 | A  | * | 7/2000 | Deubler et al. ................. 361/782 |
| 6,225,777 | B1 | * | 5/2001 | Garcia et al. .................. 320/112 |
| 6,587,951 | B1 | * | 7/2003 | Flanigan ....................... 713/310 |
| 7,672,141 | B2 | * | 3/2010 | Middleton et al. ............ 361/785 |
| 8,358,513 | B2 | * | 1/2013 | Kim ............................... 361/807 |
| 8,652,661 | B2 | * | 2/2014 | Kim ................................. 429/7 |
| 8,691,406 | B2 | * | 4/2014 | Jang et al. ......................... 429/7 |
| 8,934,261 | B2 | * | 1/2015 | Lin et al. ...................... 361/792 |

(Continued)

*Primary Examiner* — David M Sinclair
*Assistant Examiner* — Theron Milliser
(74) *Attorney, Agent, or Firm* — Novak Druce Connolly Bove + Quigg LLP

(57) ABSTRACT

An electronic device includes a bottom plate, an installation board, a circuit board, a battery, and a power supply control module. The power supply control module includes a control member and an activating member, and the activating member is pressed against the control member when the electronic device is assembled. So long as the control member remains pressed by the activating member, a flow of electrical power from the battery to the circuit board is permitted. When the electronic device is disassembled, the disassembly moves the activating member away from the activating member and cuts off the power from the battery to the circuit board, to avoid electrical short circuits or other damage that might otherwise occur if the flow of electrical power was maintained during disassembly.

5 Claims, 4 Drawing Sheets

(56) References Cited

U.S. PATENT DOCUMENTS

| | | | |
|---|---|---|---|
| 9,011,164 B2* | 4/2015 | Filman et al. | 439/74 |
| 2005/0003266 A1* | 1/2005 | Wulff | 429/97 |
| 2006/0017673 A1* | 1/2006 | Chen et al. | 345/87 |
| 2007/0019374 A1* | 1/2007 | Springer et al. | 361/685 |
| 2007/0019375 A1* | 1/2007 | Ligtenberg et al. | 361/685 |
| 2007/0035275 A1* | 2/2007 | Yang et al. | 320/112 |
| 2007/0194526 A1* | 8/2007 | Randall | 273/237 |
| 2007/0249187 A1* | 10/2007 | Chen | 439/74 |
| 2007/0281510 A1* | 12/2007 | Lin et al. | 439/74 |
| 2008/0075517 A1* | 3/2008 | Vuong | 400/486 |
| 2008/0101000 A1* | 5/2008 | Asawa et al. | 361/681 |
| 2008/0174420 A1* | 7/2008 | Hsu et al. | 340/539.11 |
| 2009/0169982 A1* | 7/2009 | Goto | 429/100 |
| 2009/0323292 A1* | 12/2009 | Hwang et al. | 361/730 |
| 2010/0061040 A1* | 3/2010 | Dabov et al. | 361/679.01 |
| 2010/0097750 A1* | 4/2010 | Souda | 361/679.33 |
| 2010/0151280 A1* | 6/2010 | Koh et al. | 429/7 |
| 2010/0250815 A1* | 9/2010 | Street et al. | 710/303 |
| 2011/0058319 A1* | 3/2011 | Kim et al. | 361/679.01 |
| 2011/0128694 A1* | 6/2011 | Saito | 361/679.33 |
| 2011/0176283 A1* | 7/2011 | Takei | 361/752 |
| 2011/0188179 A1* | 8/2011 | Myers et al. | 361/679.01 |
| 2011/0202190 A1* | 8/2011 | Venkatakrishnan et al. | 700/286 |
| 2011/0279931 A1* | 11/2011 | Nakamura | 361/42 |
| 2012/0015530 A1* | 1/2012 | Tatsukami | 439/64 |
| 2012/0028082 A1* | 2/2012 | Lee et al. | 429/7 |
| 2012/0129017 A1* | 5/2012 | Ota | 429/7 |
| 2012/0162954 A1* | 6/2012 | Tachikawa et al. | 361/809 |
| 2012/0194997 A1* | 8/2012 | McClure et al. | 361/679.55 |
| 2013/0217444 A1* | 8/2013 | Lee et al. | 455/566 |
| 2013/0301272 A1* | 11/2013 | Wang | 362/293 |
| 2014/0063708 A1* | 3/2014 | Liu | 361/679.02 |

* cited by examiner

ELECTRONIC DEVICE WITH POWER SUPPLY CONTROL MODULE

BACKGROUND

1. Technical Field

The present disclosure relates to electronic devices, and more particularly to an electronic device with a power supply control module.

2. Description of Related Art

Mass-produced items such as electronic devices must be tested for all of the functions to ensure certain qualities. The electronic device needs to be disassembled and assembled repeatedly to test a printed circuit board, such as a main board. During disassembly process, tester always removes the printed circuit board when a battery provides power to the printed circuit board, thus making the printed circuit board short circuit and damaging the printed circuit board.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
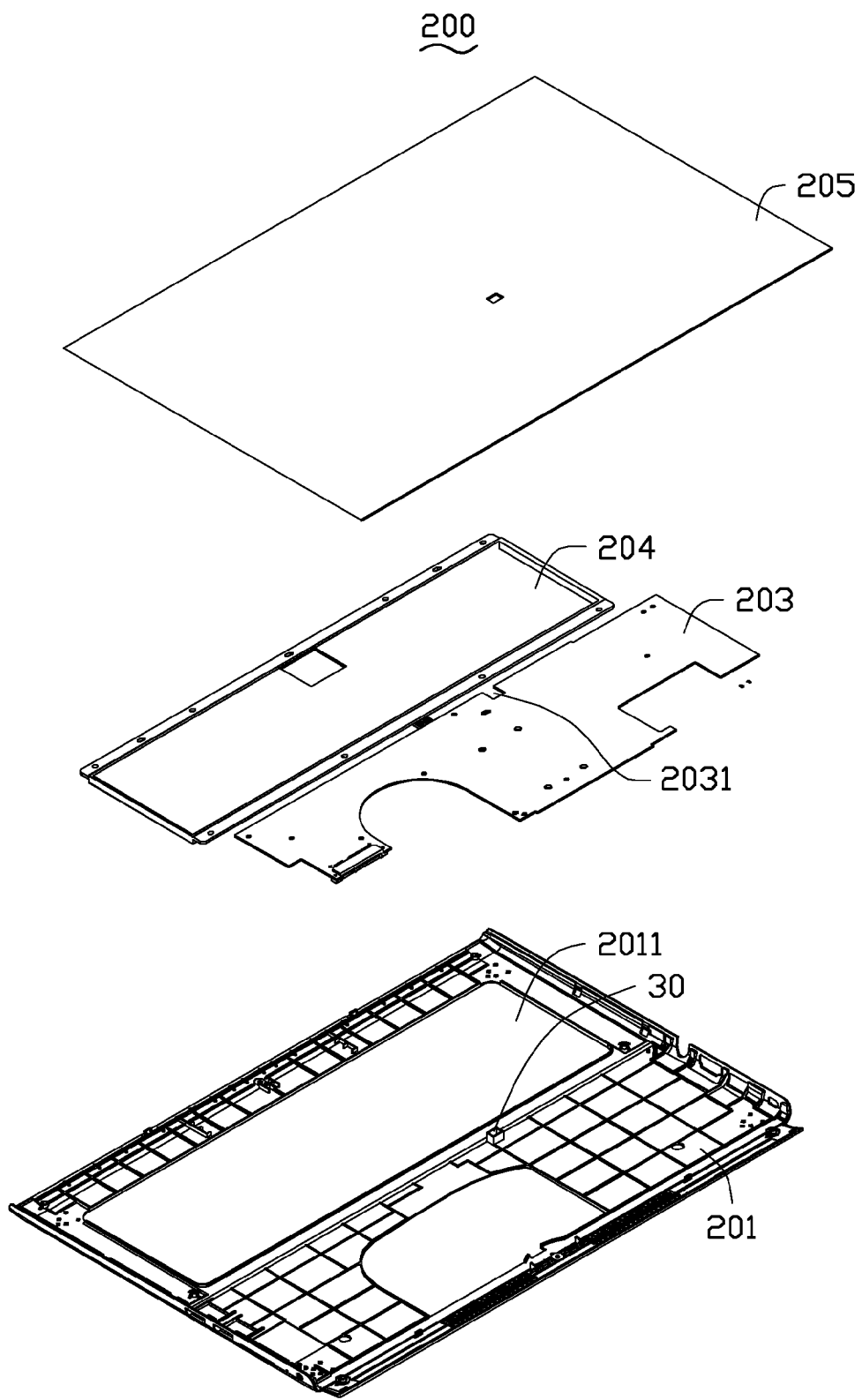
FIG. 1 is an exploded, isometric view of a electronic device in accordance with an embodiment.

Referring to FIG. 1, an electronic device 200 in accordance with an embodiment includes a power supply control module 100 (shown in FIG. 4), a bottom plate 201, a circuit board 203, a battery 204, and an installation board 205. In one embodiment, the electronic device may be a portable computer, and the circuit board 203 is a main board.

Figure 2:
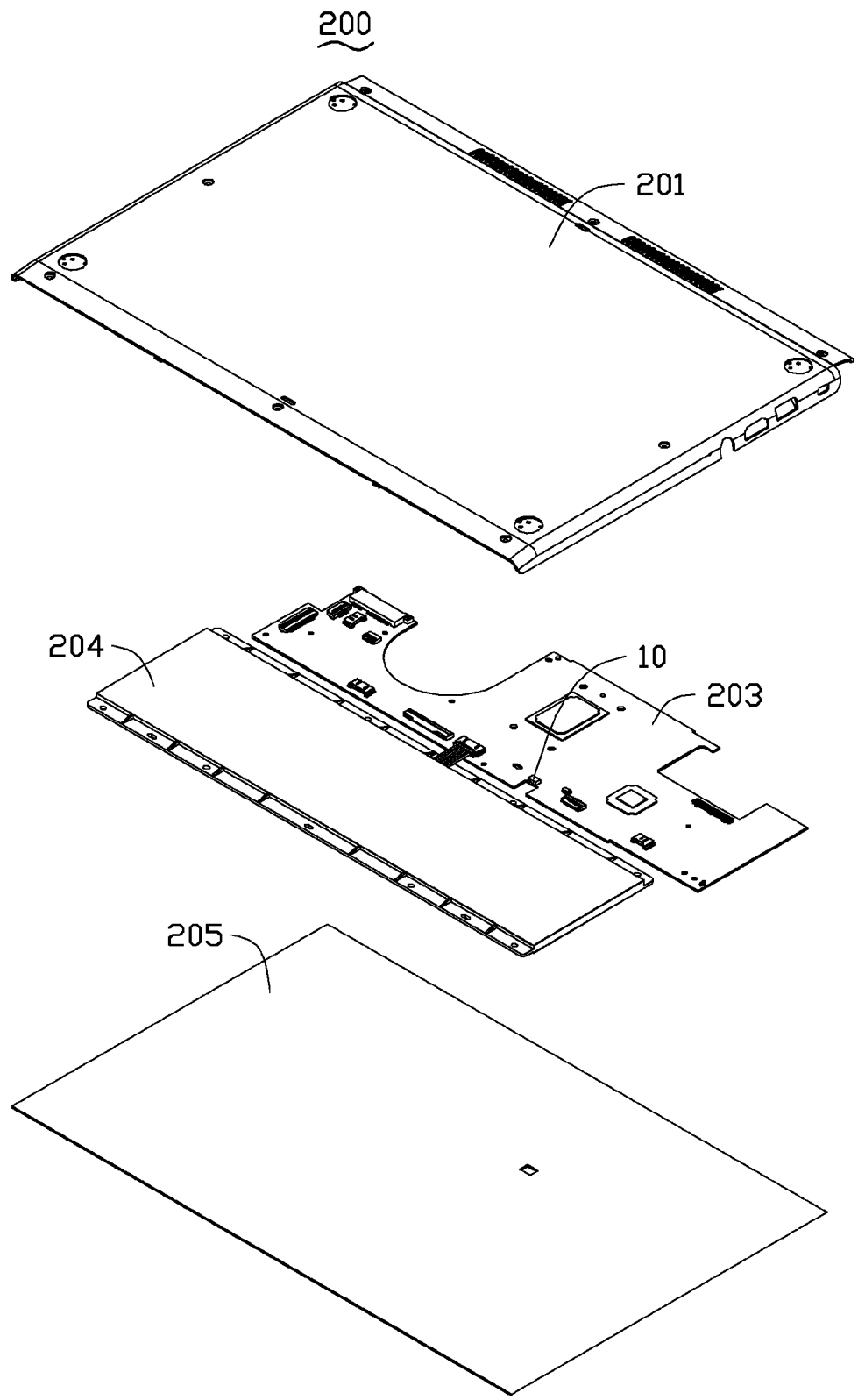
FIG. 2 is similar to FIG. 1, but viewed from a different aspect.
Figure 4:
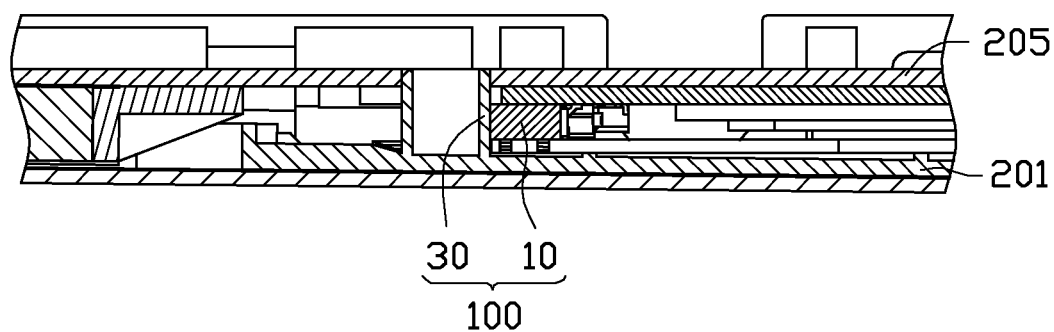
FIG. 4 is a cross-sectional view of the electronic device, taken along the line IV-IV of FIG. 3.

Referring to FIGS. 2 and 4, the power supply control module 100 includes a control member 10 and an activating member 30. The control member 10 is located on the circuit board 203. In one embodiment, the control member 10 is a switch, and in another embodiment, the control member 10 is a protruding structure. The activating member 30 protrudes from the bottom plate 201. In one embodiment, the activating member 30 is substantially perpendicular to the bottom plate 201. The control member 10 is switched on when pressed by the activating member 30 and switched off when the activating member 30 ceases to press.

The bottom plate 201 defines a receiving slot 2011 for receiving the battery 204.

The circuit board 203 defines a cutout 2031 corresponding to the control member 10. The battery 204 is located on one side of the circuit board 203 and electrically connected with the circuit board 203 by a data bus.

Figure 3:
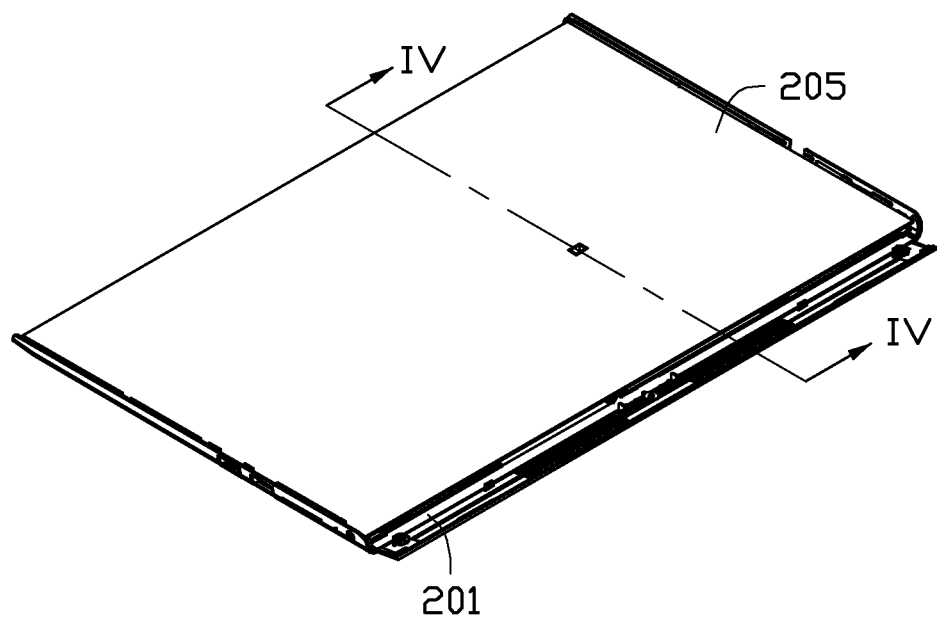
FIG. 3 is an assembled view of the electronic device of FIG. 1.

FIG. 3 shows that, in assembly, the installation board 205 is secured to the bottom plate 201 in a well-known manner, such as by screw or bolt. The circuit board 203 and the battery 204 are sandwiched between the bottom plate 201 and the installation board 205, and the battery 204 is received in the receiving slot 2011. The activating member 30 is positioned on the cutout 2031, and presses the control member 10 of the circuit board 203 to switch on the control member 10. The battery 204 is thereby electrically connected to the circuit board 203 and provides power to the circuit board 203.

In disassembly, the bottom plate 201 is detached from the installation board 205 and removed from the installation board 205 to disengage the activating member 30 from the control member 10. The control member 10 is thus switched off, and the battery 204 is disconnected from the circuit board 203, to stop providing power to the circuit board 203. Thus, the circuit board 203 is protected from being damaged.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. An electronic device comprising:
a bottom plate;
an installation board detachably secured to the bottom plate;
a circuit board;
a battery electrically connected with the circuit board and located on one side of the circuit board; and
a power supply control module comprising a control member and an activating member, the activating member protruding from the bottom plate, and the control member is located on the circuit board;
wherein the circuit board and the battery are located between the bottom plate and the installation board; the control member is switched on when pressed by the activating member, and the battery provides power supply to the circuit board; and the control member is disengaged from the activating member and switched off when the bottom plate is detached from the installation board to separate the activating member from the control member, and the battery stops providing power to the circuit board.

2. The electronic device of claim 1, wherein the control member is a switch.

3. The electronic device of claim 1, wherein the activating member is substantially perpendicular to the bottom plate.

4. The electronic device of claim 1, wherein the circuit board defines a cutout adjacent to the control member, for receiving the activating member.

5. The electronic device of claim 1, wherein the control member is welded on the circuit board.

* * * * *